(12) United States Patent
Oh et al.

(10) Patent No.: US 10,153,452 B2
(45) Date of Patent: Dec. 11, 2018

(54) ORGANIC LIGHT EMITTING DEVICE

(71) Applicant: SAMSUNG DISPLAY CO., LTD., Yongin-si, Gyeonggi-do (KR)

(72) Inventors: Il Soo Oh, Yongin-si (KR); Bo Ra Lee, Yongin-si (KR); Pyung Eun Jeon, Yongin-si (KR); Je Hong Choi, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/725,641

(22) Filed: Oct. 5, 2017

(65) Prior Publication Data

US 2018/0114939 A1    Apr. 26, 2018

(30) Foreign Application Priority Data

Oct. 21, 2016    (KR) .................. 10-2016-0137526

(51) Int. Cl.
*H01J 1/62* (2006.01)
*H01L 51/50* (2006.01)
*H01L 51/52* (2006.01)
*H01L 51/00* (2006.01)

(52) U.S. Cl.
CPC ...... *H01L 51/5044* (2013.01); *H01L 51/5072* (2013.01); *H01L 51/5278* (2013.01); *H01L 51/0072* (2013.01); *H01L 51/508* (2013.01); *H01L 2251/5346* (2013.01)

(58) Field of Classification Search
None
See application file for complete search history.

(56) References Cited

U.S. PATENT DOCUMENTS

| | | |
|---|---|---|
| 7,075,231 B1 | 7/2006 | Liao et al. |
| 7,126,267 B2 | 10/2006 | Liao et al. |
| 7,821,201 B2 | 10/2010 | Hatwar et al. |
| 8,283,054 B2 | 10/2012 | Spindler et al. |
| 8,603,642 B2 | 12/2013 | Hatwar et al. |
| 9,105,861 B2 | 8/2015 | Jung et al. |

FOREIGN PATENT DOCUMENTS

KR    10-2012-0078298 A    7/2012

*Primary Examiner* — Vip Patel
(74) *Attorney, Agent, or Firm* — Lee & Morse, P.C.

(57) ABSTRACT

A light emitting device including a first electrode, a light emitting portion on the first electrode, the light emitting portion including a plurality of light emitting units and at least one interconnecting layer between ones of the light emitting units that are adjacent to each other, and a second electrode on the light emitting portion. The at least one interconnecting layer includes a p-type charge generation layer doped with a p-type dopant and an n-type charge generation layer doped with an n-type dopant. At least one of the p-type charge generation layer and the n-type charge generation layer has a concentration gradient of the p-type dopant or the n-type dopant.

14 Claims, 2 Drawing Sheets

ORGANIC LIGHT EMITTING DEVICE

CROSS-REFERENCE TO RELATED APPLICATION

Korean Patent Application No. 10-2016-0137526 filed on Oct. 21, 2016, in the Korean Intellectual Property Office, and entitled: "Organic Light Emitting Device," is incorporated by reference herein in its entirety.

BACKGROUND

1. Field

Embodiments relate to an organic light emitting device.

2. Description of the Related Art

An organic light emitting device includes a pair of electrodes and an organic layer interposed between the electrodes, which is an active light emitting device using a phenomenon in which when a current flows through the electrodes, light is emitted while electrons and holes injected through the electrodes are combined in the organic layer. Such an organic light emitting device is lightweight, has a structure that may be manufactured with simple parts and by a simple manufacturing process, and provides a high-definition wide viewing angle. In addition, the organic light emitting device may realize high color purity and a moving image perfectly, and since it may be driven with low power consumption and a low voltage, it may be suitable for portable electronic devices.

A general organic light emitting device may include a substrate, a negative electrode, an organic layer, and a positive electrode, and the organic layer may include a hole injection layer, a hole transporting layer, an electron blocking layer, a light emitting layer, a hole blocking layer, an electron transporting layer, and an electron injection layer.

SUMMARY

Embodiments are directed to a light emitting device including a first electrode, a light emitting portion on the first electrode, the light emitting portion including a plurality of light emitting units and at least one interconnecting layer between ones of the light emitting units that are adjacent to each other, and a second electrode on the light emitting portion. Each interconnecting layer includes a p-type charge generation layer doped with a p-type dopant and an n-type charge generation layer doped with an n-type dopant. At least one of the p-type charge generation layer and the n-type charge generation layer has a concentration gradient of the p-type dopant or the n-type dopant.

In the p-type charge generation layer, the concentration of the p-type dopant may be highest at an interface between the p-type charge generation layer and the n-type charge generation layer. The concentration of the p-type dopant may decrease as a distance from the interface increases.

In the n-type charge generation layer, the concentration of the n-type dopant may be lowest at the interface between the p-type charge generation layer and the n-type charge generation layer, and the concentration of the n-type dopant increases as a distance from the interface increases.

The amount of the p-type dopant of the p-type charge generation layer may be in a range of about 7 at % to about 20 at % in the interface between the p-type charge generation layer and the n-type charge generation layer.

The amount of the n-type dopant of the n-type charge generation layer may be in a range of about 0.01 at % to about 5 at % in the interface between p-type charge generation layer and the n-type charge generation layer.

A lowest unoccupied molecular orbital (LUMO) of the p-type dopant may be less than about −5.0 eV.

A highest occupied molecular orbital (HOMO) of the n-type dopant may exceed about −3.0 eV.

The first electrode may be a anode, and the second electrode may be a cathode.

The interconnecting layer may include an n-type charge generation layer in an area adjacent to the anode and a p-type charge generation layer in an area adjacent to the cathode.

The light emitting portion may include different light emitting units that respectively emit light of different wavelengths. The light emitting portion may emit white light.

The light emitting portion may emit blue light.

The light emitting device may further include a color conversion layer on the light emitting portion, the color conversion layer absorbing blue light such that the light emitting device emits red light or green light.

The light emitting unit may include a hole injection layer in an area adjacent to the p-type charge generation layer of the interconnecting layer and an electron injection layer in an area adjacent to the n-type charge generation layer of the interconnecting layer.

The p-type charge generation layer may have a concentration gradient of the p-type dopant. The n-type charge generation layer may have a concentration gradient of the n-type dopant.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
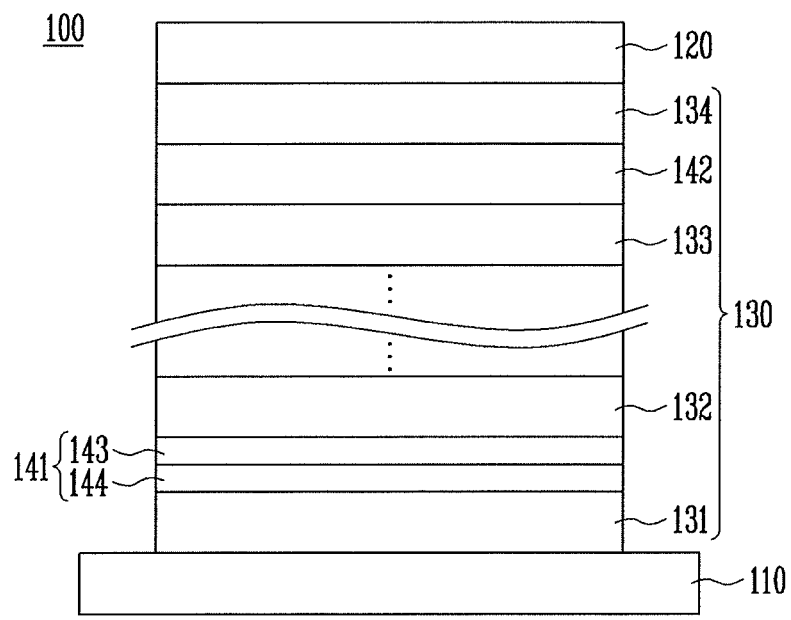
FIG. 1 illustrates a cross-sectional view of a light emitting device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of a light emitting device 100 according to an exemplary embodiment. Referring to FIG. 1, the light emitting device 100 according to an exemplary embodiment may include a first electrode 110, a light emitting portion 130 that is provided on the first electrode 110 and that includes a plurality of light emitting units and at least one interconnecting layer positioned between ones of the light emitting units that are adjacent to each other, and a second electrode 120 provided on the light emitting portion 130. The at least one interconnecting layer includes a p-type charge generation layer doped with a p-type dopant and an n-type charge generation layer doped with an n-type dopant. At least one of the p-type charge generation layer and the n-type charge generation layer may have a concentration gradient of the respective p-type dopant or n-type dopant.

Hereinafter, constituent elements included in the light emitting device 100 of FIG. 1 will be described in detail.

The first electrode 110 and the second electrode 120 may receive a voltage and current through an electrical wire from an external power source. The light emitting device 100 according to the exemplary embodiment may operate when a potential is applied between the first electrode 110 and the second electrode 120. The first electrode 110 and the second electrode 120 may be formed by vapor deposition, sputtering, or the like. The first electrode 110 and the second electrode 120 may be made of at least one of an alkali metal such as indium tin oxide, indium zinc oxide, tin oxide ($SnO_2$), zinc oxide (ZnO), Li, Na, K, Rb, Cs, or Fr, which have excellent conductivity, an alkaline earth metal such as Be, Mg, Ca, Sr, Ba, or Ra, and a lanthanide-based metal such as lanthanum (La), cerium (Ce), preseodyminum (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu), or may be made of a combination thereof, as examples.

Each of the first electrode 110 and the second electrode 120 may function as an anode and a cathode, or a cathode and an anode. When the first electrode 110 functions as a cathode and the second electrode 120 functions as an anode, a potential may be applied such that the first electrode 110 may have a more positive potential than the second electrode 120.

The light emitting portion 130 may be provided on the first electrode 110. The light emitting portion 130 may include an interconnecting layer positioned between ones of the plurality of light emitting units that adjacent to each other. For convenience of illustration, FIG. 1 illustrates only a first light emitting unit 131, a second light emitting unit 132, an (n−1)-th light emitting unit 133, an n-th light emitting unit 134 and a first interconnecting layer 141, and a (n−1)-th interconnecting layer 142 of the light emitting portion having n-numbered light emitting units. According to exemplary embodiments, two or more light emitting units may be included in the light emitting device 100, and thus, one or more interconnecting layers may be included therein. Hereinafter, the first light emitting unit 131, the second light emitting unit 132, and the first interconnecting layer 141 will be described. The following description may be applied to other light emitting units or connection layers of the light emitting device 100.

The first light emitting unit 131 and the second light emitting unit 132 may include a plurality of layers. For example, the first light emitting unit 131 and/or the second light emitting unit 132 may respectively include at least one of a hole injection layer HIL, a hole transporting layer HTL, an emission layer EML, a hole blocking layer HBL, an electron transporting layer ETL, and an electron injection layer EIL. The acronyms or abbreviations, HIL, HTL, EML, HBL, ETL, and EIL are layers that may have additional functions. For example, the hole transporting layer HTL may serve to transport holes, and may further perform a function of an exciton blocking layer EBL that blocks excitons generated from the emission layer according to a kind of selected compounds from being diffused. Similarly, the electron transporting layer ETL may serve to transport electrons, and may further perform a function of an exciton blocking layer EBL that prevents excitons generated from the emission layer according to a kind of selected compounds from being diffused.

The first light emitting unit 131 and the second light emitting unit 132 may have different layered structures. For example, each of the first light emitting unit 131 and/or the second light emitting unit 132 may have a layered structure selected from HTL/ETL, HTL/EML/ETL, HIL/HTL/EML/ETL, HIL/HTL/EML/ETL/EIL, HIL/HTL/HBL/EML/ETL/EIL, and HIL/HTL/EML/HBL/ETL/EIL. For example, the first light emitting unit 131 may include the electron injection layer EIL, and the second light emitting unit 132 may include the hole injection layer HIL. In addition, the electron injection layer EIL of the first light emitting unit 131 and the hole injection layer HIL of the second light emitting unit 132 may be connected by the first interconnecting layer 141.

Materials included in each layer may be selected from a hole injection material, a hole transporting material, an emission material, a hole blocking material, an electron transporting material, and an electron injection material. In addition, a method of forming each layer may be selected from known various methods such as a vacuum deposition method, a spin coating method, a casting method, an LB method, or the like. When the vacuum deposition method is selected, a deposition condition may vary according to a target compound, a target layer structure, thermal characteristic, or the like. For example, the vacuum deposition method may be properly selected to have a deposition temperature of about 100 to 500 degrees Celsius, a vacuum degree of about $10^{-8}$ to $10^{-3}$ torr, and a deposition speed of about 0.01 to 100 Å/sec. When the spin coating method is selected, a coating condition may vary according to a target compound, a target layer structure, thermal characteristic, or the like. For example, the coating condition may be properly selected to have a coating speed of about 2,000 to 5,000 rpm and a temperature of about 80 to 200 degrees Celsius as a heat treatment temperature for removing a solvent after coating.

The hole injection layer may be made of a suitable hole injection material. For example, the hole injection material may include a phthalocyanine compound such as copper phthalocyanine, a triphenylamine-based material such as m-MTDATA [4,4',4"-tris (3-methylphenylphenylamino) triphenylamine] and NPB (N,N'-di (1-naphthyl)-N,N-diphenylbenzidine), or a conductive polymer such as polyaniline/dodecylbenzenesulfonic acid (PANI/DBSA) or poly (3,4-ethylenedioxythiophene)/poly (4-styrenesulfonate) (PEDOT/PSS), polyaniline/camphor sulfonic acid (PANI/CSA) or (polyaniline)/poly (4-styrenesulfonate) (PANI/PSS), etc., as examples.

In some implementations, for improving the hole injection characteristic, an inorganic metal oxide may be doped in the hole injection layer in addition to the aforementioned organic hole injection materials. For example, $MoO_3$, $V_2O_5$, $WO_3$, etc. may be doped therein. In this case, the doping concentration may be about 0.1 wt % to about 80 wt % based on a total weight of the hole injection layer.

A thickness of the hole injection layer may be in a range of about 10 Å to about 10,000 Å, or, for example, about 100 Å to about 1,000 Å. When the thickness of the hole injection layer is 10 Å or more, deterioration of the hole injection characteristic may be avoided. When the thickness of the hole injection layer is about 10,000 Å or less, an increase in the driving voltage may be avoided.

The hole transporting layer may be made of a suitable hole transporting material, for example, a carbazole derivative such as N-phenylcarbazole, polyvinylcarbazole, or the like, or an amine derivative having an aromatic fused ring such as N,N'-bis (3-methylphenyl)-N,N'-diphenyl-[1,1-biphenyl]-4,4'-diamine (TPD), N,N'-di(naphthalen-1-yl)-N, N'-diphenylbenzidine (α-NPD), or the like, or a triphenylamine-based material such as TCTA (4,4',4"-tris (N-carbazolyl) triphenylamine), or the like. Among these, for example, TCTA may serve to transport holes, and may serve to prevent excitons from being diffused from the emission layer.

A thickness of the hole transporting layer may be in a range of about 50 Å to about 1,000 Å, or, for example, about 100 Å to about 600 Å. When the thickness of the hole transporting layer is about 50 Å or more, a deterioration of the hole transporting characteristic may be avoided. When the thickness of the hole transporting layer is about 1,000 Å or more, an increase in the driving voltage may be avoided.

The emission layer may be made of a single emission material, and may also include a host and a dopant.

For example, the host may include CBP (4,4'-N,N'-dicarbazole-biphenyl), PVK (poly (n-vinylcarbazole)), 9,10-di (naphthalene-2-yl)anthracene (ADN), TCTA, or TPBI (1,3, 5-tris(N-phenylbenzimidazole-2-yl)benzene), as examples.

A thickness of the emission layer may be in a range of about 100 Å to about 1,000 Å, or, for example, about 200 Å to about 600 Å. When the thickness of the emission layer is about 100 Å or more, deterioration of the emission characteristic may be avoided, and when the thickness of the emission layer is about 1,000 Å or less, an increase in the driving voltage may be avoided.

The hole blocking layer may serve to prevent triplet excitons or holes of the emission layer from being diffused into the cathode or the like. The hole blocking layer may include an oxadiazole derivative, a triazole derivative, a phenanthroline derivative, or the like.

A thickness of the hole blocking layer may be in a range of about 50 Å to about 1,000 Å, or, for example, about 100 Å to about 300 Å. When the thickness of the hole blocking layer is about 50 Å or more, deterioration of the hole blocking characteristic may be avoided. When the thickness of the hole blocking layer is about 1,000 Å or more, a increase in the driving voltage may be avoided.

The electron transporting layer ETL may be made of a suitable electron transporting material such as tris(8-quinolinolate) aluminum ($Alq_3$), TAZ, Bphen (4,7-diphenyl-1,10-phenanthroline), TPQ (1,3,4-tris[(3-phenyl-6-trifluoromethyl)qunoxaline-2-yl]benzene)), BeBq2 (bis(benzoquinoline)berellium), or the like.

The first interconnecting layer 141 may be provided between the first light emitting unit 131 and the second light emitting unit 132. Charges may be generated in the first interconnecting layer 141. For example, when a voltage as large as a built-in potential is applied to the light emitting device 100, charges may be generated in the first connection layer 141. Carriers may be injected into the first light emitting unit 131 and the second light emitting unit 132 from the first interconnecting layer 141 in which the charges are generated. When the carriers are injected into the first light emitting unit 131 and the second light emitting unit 132, the light emitting device 100 may operate more efficiently. For efficiently injecting the carriers, the first interconnecting layer 141 may be doped with a dopant such as an organic material, a metal, a metal compound, or an inorganic compound.

The dopant may be a p-type or n-type dopant. The first interconnecting layer 141 may include layers that are respectively doped with a p-type dopant and an n-type dopant. In this case, the layer doped with the p-type dopant is referred to herein as a p-type charge generation layer 143, and the layer doped with the n-type dopant is referred to herein as an n-type charge generation layer 144. The p-type charge generation layer 143 may inject holes into the second light emitting unit 132 adjacent thereto. In addition, the n-type charge generation layer 144 may inject electrons into the first light emitting unit 131 adjacent thereto.

The p-type charge generation layer 143 may be formed through a combination of an organic material having the characteristic of the hole transporting layer HTL and a p-type dopant having a lowest unoccupied molecular orbital (LUMO) of less than about −5.0 eV. In this case, the p-type dopant may be, for example, a HAT-CN, TCNQ, or NDP-9 based dopant. HAT-CN, TCNQ, and NDP-9 are respectively represented by Chemical Formulae 1 to 3.

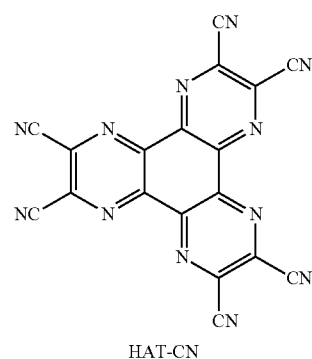

[Chemical Formula 1]

HAT-CN

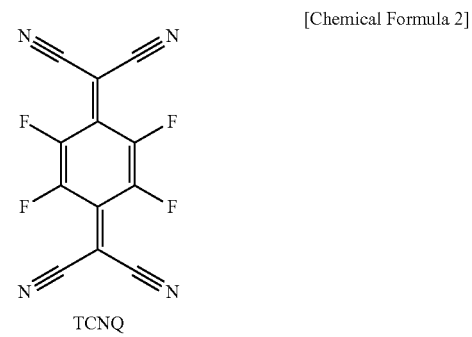

[Chemical Formula 2]

TCNQ

[Chemical Formula 3]

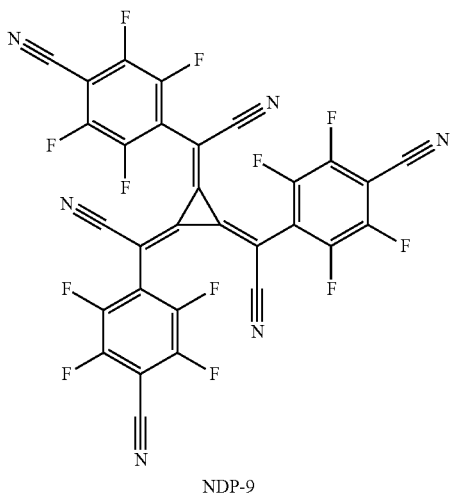

NDP-9

The n-type charge generation layer 144 may be formed through a combination of an organic material having the characteristic of the electron transporting layer ETL and an n-type dopant having a highest occupied molecular orbital (HOMO) of greater than about −3.0 eV. The n-type dopant may be selected from an alkali metal such as Li, Na, K, Rb, Cs, and Fr; an alkaline earth metal such as Be, Mg, Ca, Sr, Ba, and Ra; and a lanthanide-based metal such as lanthanum (La), cerium (Ce), preseodyminum (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu), as examples.

The p-type charge generation layer 143 and the n-type charge generation layer 144 may have a thickness of about 5 nm to about 15 nm. The thickness range may be optimized such that the p-type charge generation layer 143 and the n-type charge generation layer 144 inject holes and electrons into adjacent light emitting units, respectively.

Figure 2:
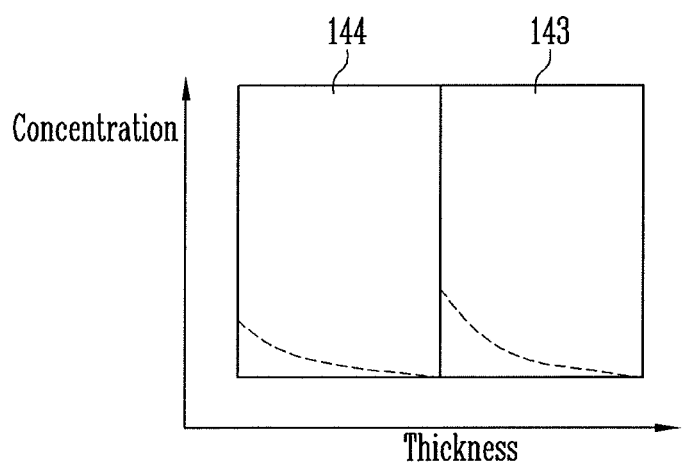
FIG. 2 illustrates a concentration graph of dopants contained in an interconnecting layer of a light emitting device according to an exemplary embodiment.

FIG. 2 illustrates a concentration graph of dopants contained in an interconnecting layer of a light emitting device according to an exemplary embodiment. Hereinafter, FIG. 2 will be described with reference to FIG. 1.

According to the exemplary embodiment, the p-type charge generation layer 143 and/or the n-type charge generation layer 144 may include a dopant concentration gradient. Thus, the dopant concentration gradient may be present in either or both of the p-type charge generation layer 143 and the n-type charge generation layer 144.

In the p-type charge generation layer 143, a concentration of the p-type dopant may be the highest at an interface between the p-type charge generation layer 143 and the n-type charge generation layer 144. The concentration of the p-type dopant may decrease as a distance from the interface increases. Accordingly, the concentration of the p-type dopant may be the lowest at an interface between the second light emitting unit 132 and the p-type charge generation layer 143. When the concentration of the p-type dopant is low at the interface between the second light emitting unit 132 and the p-type charge generation layer 143, a hole injecting barrier for moving to the hole transporting layer of the second light emitting unit 132 may be lowered. In addition, when the concentration of the p-type dopant is high at the interface between the p-type charge generation layer 143 and the n-type charge generation layer 144, an energy barrier at a pn junction interface may be lowered.

The p-type dopants may be contained in the p-type charge generation layer 143 in an amount of about 5 at % to 20 at %. When the p-type dopants are present at in an amount of about 5 at % or more, holes injected by the p-type charge generation layer 143 may be sufficient. When the p-type dopants of less than about 20 at % are contained, the diffusion of the dopants between the interfaces at high temperatures due to a large doping amount may be avoided. If the dopants were to be diffused, a chemical reaction could occur between the dopants, thus a width of a depletion layer could increase. The increase of the width of the depletion layer could cause an increase of the drive voltage and a brightness failure of a panel.

The p-type dopants may be present in the interface between the p-type charge generation layer 143 and the n-type charge generation layer 144 in an amount of about 7 at % to about 20 at %. When the p-type dopants are present in an amount of more than about 7 at %, an effect of lowering the energy barrier at the pn junction interface may be sufficient. When the p-type dopants are present in an amount of less than about 20 at %, diffusion of the p-type dopant into the n-type charge generating layer 144 may be avoided.

In the n-type charge generation layer 143, the concentration of the n-type dopant may be the lowest at the interface between the interface between the p-type charge generation layer 143 and the n-type charge generation layer 144. The concentration of the n-type dopant may increase as a distance from the interface increases. Accordingly, the concentration of the n-type dopant may be the highest at an interface between the first light emitting unit 131 and the n-type charge generation layer 144. When the concentration of the n-type dopant is low at the interface between the p-type charge generation layer 143 and the n-type charge generation layer 144, diffusion of the n-type dopants into the p-type charge generation layer 143 may be avoided. In addition, when the concentration of the n-type dopant is high at the interface between the first light emitting unit 131 and the n-type charge generation layer 144, electrons may move to the first light emitting unit 131 more easily.

The n-type dopants may be contained in the n-type charge generation layer 144 in an amount of about 0.01 at % to about 10 at %. When the n-type dopants of about 0.01 at % or more are present, an effect of lowering an electron injecting barrier through the n-type dopants may be sufficient. In addition, when the n-type dopants are present in an amount of about 10 at % or less, diffusion of the n-type dopants may be prevented, and an increase in the driving voltage, which may cause a brightness failure of the panel, may be avoided.

The n-type dopants may be contained in the interface between the interface between the p-type charge generation layer 143 and the n-type charge generation layer 144 in an amount of about 0.01 at % to about 5 at %. When the n-type dopants of more than about 0.01 at % are contained, effects of improving mobility of the electrons and lowering the electron injecting barrier through the n-type dopants may be sufficient. In addition, when the n-type dopants of less than about 5 at % are present, diffusion of the n-type dopants into the p-type charge generation layer 143 may be avoided.

As described above, the p-type dopants or n-type dopants of the light emitting device 100 according to the exemplary embodiment may be prevented from moving to the adjacent layer. Thus, even if the light emitting device 100 according to the exemplary embodiment is used for a long period of time, the diffusion of the dopants, the increase of the driving voltage, and the luminance deterioration may not occur. Accordingly, the light emitting device 100 according to the exemplary embodiment may have a long lifespan.

According to the exemplary embodiment, the p-type charge generation layer 143 and/or the n-type charge generation layer 144 may have the concentration gradient of the p-type dopants and the concentration gradient of the n-type dopants, respectively, as described above. Accordingly, a light emitting device having a concentration gradient of dopants only in the p-type charge generation layer 143 and having no concentration gradient of dopants in the n-type charge generation layer 144 may be provided, or a light emitting device having a concentration gradient of dopants only in the n-type charge generation layer 144 and having no concentration gradient of dopants in the p-type charge generation layer 143 may be provided, or a light emitting device having concentration gradients of dopants in both the p-type charge generation layer 143 and the n-type charge generation layer 144 may be provided.

Figure 3:
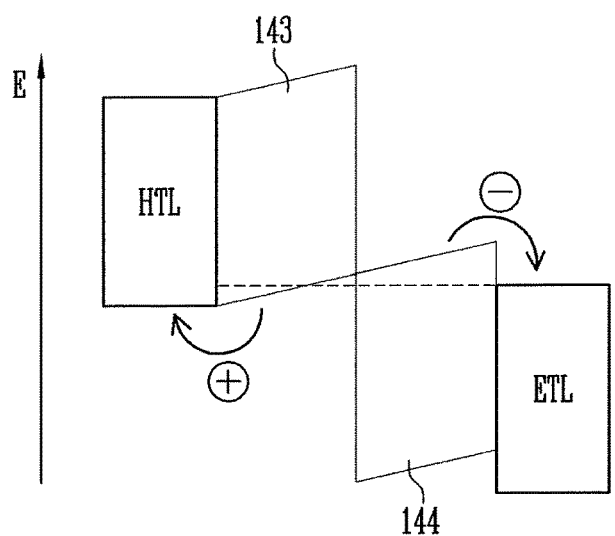
FIG. 3 illustrates an energy level of an interconnecting layer of a light emitting device according to an exemplary embodiment.

FIG. 3 illustrates an energy level of an interconnecting layer of a light emitting device according to an exemplary embodiment. Hereinafter, FIG. 3 will be described with reference to FIG. 1.

Referring to FIG. 3, a hole injecting barrier between the p-type charge generation layer 143 and the second light emitting unit 132 may be lowered by the p-type dopants. Thus, holes (+) may be easily injected into the hole transporting layer HTL of the second light emitting unit 132. In addition, an electron injecting barrier between the n-type charge generation layer 144 and the first light emitting unit 131 may be lowered by the n-type dopants. Thus, electrons (−) may be easily injected into the electron transporting layer ETL of the first light emitting unit 131. According to the exemplary embodiment, the electrons (−) and the holes (+) may easily move to the light emitting units, thereby improving efficiency of the light emitting device 100.

Figure 4:
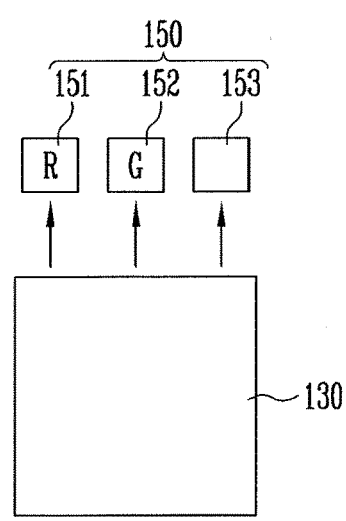
FIG. 4 illustrates a light emitting portion and a color conversion layer of a light emitting device according to an exemplary embodiment.

FIG. 4 illustrates a light emitting portion and a color conversion layer of a light emitting device according to an exemplary embodiment.

According to the exemplary embodiment, the plurality of light emitting units included in the light emitting portion 130 may emit light of different wavelengths. For example, the plurality of light emitting units may emit red light, green light, and blue light, respectively. In some implementations, the plurality of light emitting units may emit yellow light and blue light, respectively. In some implementations, the light emitting portion 130 including the plurality of light emitting units may emit white light.

According to an exemplary embodiment, the light emitting portion 130 may emit blue light. In this case, a color conversion layer 150 that absorbs blue light and emits red light or green light may be provided on the light emitting portion 130. The color conversion layer 150 may include a red conversion layer 151 that absorbs blue light and emits red light, a green conversion layer 152 that absorbs blue light and emits green light, and a transparent layer 153 that emits blue light as it is.

According to the exemplary embodiment, the color conversion layer 150 may include a quantum dot. The quantum dot included in the color conversion layer 150 may be a II-VI based quantum dot including Cd/Se/ZnS, CdSe/CdS/ZnS, ZnSe/ZnS, or ZnTe/ZnSe. In some implementations, the quantum dot may be a III-V based quantum dot including InP/ZnS or a quantum dot including $CuInS_2/ZnS$. The quantum dots may be distributed in the color conversion layer 150 at a concentration of about 3 $g/cm^3$ to about 6 $g/cm^3$. When the color conversion layer 150 includes the quantum dot, a wavelength band of light converted by the quantum dot may vary depending on a size of the quantum dot. For example, depending on the size of the quantum dot, the quantum dot may be determined to be one of a quantum dot emitting green light, a quantum dot emitting red light, and a quantum dot emitting blue light.

Hereinafter, the light emitting device the exemplary embodiment will be described with reference to an Example and Comparative Examples.

The following Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further, it is to be understood that the embodiments are not limited to the particular details described in the Examples and Comparative Examples.

Light emitting devices of an Example and Comparative Examples respectively have a structure in which the anode, the first light emitting unit, the interconnecting layer, the second light emitting unit, and the cathode are sequentially stacked. The interconnecting layer includes the p-type charge generation layer and the n-type charge generation layer. The light emitting devices of the Example and the Comparative Examples were respectively manufactured with known materials. The light emitting devices of the Example and the Comparative Examples differ only in the concentrations of the dopants contained in the p-type charge generation layer and the n-type charge generation layer.

Lifespans, driving voltages, and voltage increase degrees for the light emitting devices of the Example and the Comparative Examples were measured as follows. The term "lifetime" refers to a period for which about 95% of an original luminance of the light emitting device may be maintained. The voltage increase was measured at room temperature and about 85° C. when the light emitting device was used for about 100 hours. The measurement results are shown in Table 1 below.

TABLE 1

| | p-type dopant concentration (at %) | n-type dopant concentration (at %) | Driving voltage (V) | Lifespan (hr) | Voltage increase @RT (V) | Voltage increase @85° C. (V) |
|---|---|---|---|---|---|---|
| Example 1 | 3/8/15 | 0.7/1.1/1.5 | 9.30 | 245 | 0.007 | 0.01 |
| Comparative Example 1 | 7 | 1.5 | 9.42 | 240 | 0.1 | 0.27 |
| Comparative Example 2 | 15/8/3 | 1.5/1.1/0.7 | 10.0 | 245 | 0.17 | 0.10 |

In Example 1, the concentration of the p-type dopant in the p-type charge generation layer was about 15 at % at the interface between the p-type charge generation layer. The concentration of the p-type dopant decreased to about 8 at % and then to about 3 at % as a distance away from the interface increased. In Example 1, the concentration of the n-type dopant was about 0.7 at % at the interface between the p-type charge generation layer and the n-type charge generation layer. The concentration of the n-type dopant increased to about 1.1 at % and then to about 1.5 at % as a distance away from the interface increased.

In Comparative Example 1, the concentration of the p-type dopant was about 7 at % throughout the p-type charge generation layer, and the concentration of the n-type dopant was about 1.5 at % throughout the n-type charge generation layer. There was substantially no dopant concentration gradient in each charge generation layer.

Comparative Example 2 had an opposite concentration gradient to that of Example 1. In Comparative Example 2, the concentration of the p-type dopant was the lowest at the interface between the p-type charge generation layer and the n-type charge generation layer, and the concentration of the n-type dopant was the highest at the interface between the p-type charge generation layer and the n-type charge generation layer.

Referring to Table 1, in Example 1, the driving voltage and the voltage increase were shown to be the lowest, and the lifespan was shown to be the longest. When a light emitting device has a low driving voltage, the light emitting device may have excellent efficiency, and since the voltage increase thereof is small even if it is used for a long time, the lifespan thereof may be long. Compared with the light emitting device of Example 1, in the light emitting devices of Comparative Examples 1 and 2, the driving voltage and the voltage increase were shown to be relatively high and the lifespan was shown to be relatively short. For example, based on the finding that the voltage increase was high, it can be concluded that the diffusion of the dopants was relatively increased in the light emitting devices according to Comparative Examples 1 and 2.

The light emitting device according to the exemplary embodiment may be used as a light source of a lighting device or a display device. The display device according to the embodiment may be applied in various electronic devices. For example, the display device may be applied to a television, a notebook computer, a mobile phone, a smart phone, a smart pad, a PMP, a PDA, a navigation device, and various wearable devices such as a smart watch.

By way of summation and review, in order to minimize power consumption of an organic light emitting device, a tandem type organic light emitting device that includes the plurality of light emitting units and in which an interconnecting layer is respectively interposed between the light emitting units, has been under development.

The light emitting device according to embodiments may have high efficiency and a long lifespan. In addition, the light emitting device according to exemplary embodiments may prevent a driving voltage from being increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

DESCRIPTION OF SYMBOLS

| | |
|---|---|
| 100: light emitting device | 110: first electrode |
| 120: second electrode | 130: light emitting portion |
| 131: first light emitting unit | 132: second light emitting unit |
| 141: first interconnecting layer | |
| 143: p-type charge generation layer | |
| 144: n-type charge generation layer | 150: color conversion layer |

What is claimed is:

1. A light emitting device, comprising:
a first electrode;
a light emitting portion on the first electrode, the light emitting portion including a plurality of light emitting units and at least one interconnecting layer between ones of the light emitting units that are adjacent to each other; and
a second electrode on the light emitting portion,
wherein the interconnecting layer includes a p-type charge generation layer doped with a p-type dopant, an n-type charge generation layer doped with an n-type dopant, and an interface between the p-type charge generation layer and the n-type generation layer, and
at least one of the following conditions is met:
the p-type charge generation layer has a concentration gradient wherein a concentration of the p-type dopant is highest at the interface between the p-type charge generation layer and the n-type charge generation layer and the concentration of the p-type dopant in the p-type charge generation layer decreases as a distance from the interface increases, and
the n-type charge generation layer has a concentration gradient wherein a concentration of the n-type dopant is lowest at the interface between the p-type charge generation layer and the n-type charge generation layer and the concentration of the n-type dopant in the n-type charge generation layer increases as a distance from the interface increases.

2. The light emitting device as claimed in claim 1, wherein:
the p-type charge generation layer includes the concentration gradient in which the concentration of the p-type dopant is highest at an interface between the p-type charge generation layer and the n-type charge generation layer, and the concentration of the p-type dopant decreases as a distance from the interface increases.

3. The light emitting device as claimed in claim 1, wherein:
the n-type charge generation layer includes the concentration gradient in which the concentration of the n-type dopant is lowest at an interface between the p-type charge generation layer and the n-type charge generation layer, and the concentration of the n-type dopant increases as a distance from the interface increases.

4. The light emitting device as claimed in claim 1, wherein:
the amount of the p-type dopant of the p-type charge generation layer is in a range of about 7 at % to about 20 at % at an interface between the p-type charge generation layer and the n-type charge generation layer.

5. The light emitting device as claimed in claim 1, wherein:
the amount of the n-type dopant of the n-type charge generation layer is in a range of about 0.01 at % to about 5 at % at an interface between p-type charge generation layer and the n-type charge generation layer.

6. The light emitting device as claimed in claim 1, wherein:
a lowest unoccupied molecular orbital (LUMO) of the p-type dopant about −5.0 eV or less.

7. The light emitting device as claimed in claim 1, wherein:

a highest occupied molecular orbital (HOMO) of the n-type dopant is about −3.0 eV or more.

8. The light emitting device as claimed in claim 1, wherein:

the first electrode is a anode, and the second electrode is a cathode.

9. The light emitting device as claimed in claim 8, wherein:

the interconnecting layer includes the n-type charge generation layer in an area adjacent to the anode and the p-type charge generation layer in an area adjacent to the cathode.

10. The light emitting device as claimed in claim 1, wherein:

the light emitting portion includes different light emitting units that respectively emit light of different colors, and the light emitting portion emits white light.

11. The light emitting device as claimed in claim 1, wherein:

the light emitting portion emits blue light.

12. The light emitting device as claimed in claim 11, further comprising:

a color conversion layer on the light emitting portion, the color conversion layer converting blue light such that the light emitting device emits red light or green light.

13. The light emitting device as claimed in claim 1, wherein:

the light emitting unit includes a hole injection layer in an area adjacent to the p-type charge generation layer of the interconnecting layer and an electron injection layer in an area adjacent to the n-type charge generation layer of the interconnecting layer.

14. The light emitting device as claimed in claim 1, wherein:

the p-type charge generation layer has the concentration gradient of the p-type dopant, and the n-type charge generation layer has the concentration gradient of the n-type dopant.

* * * * *